United States Patent
Lopez

(10) Patent No.: US 10,355,168 B2
(45) Date of Patent: Jul. 16, 2019

(54) LIGHT-EMITTING DEVICE WITH PATTERNED SUBSTRATE

(71) Applicant: KONINKLIJKE PHILIPS N.V., Eindhoven (NL)

(72) Inventor: Toni Lopez, Aachen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/314,400

(22) PCT Filed: May 18, 2015

(86) PCT No.: PCT/IB2015/053639
§ 371 (c)(1),
(2) Date: Nov. 28, 2016

(87) PCT Pub. No.: WO2015/181671
PCT Pub. Date: Dec. 3, 2015

(65) Prior Publication Data
US 2017/0104130 A1 Apr. 13, 2017

Related U.S. Application Data

(60) Provisional application No. 62/005,003, filed on May 30, 2014.

(51) Int. Cl.
*H01L 33/00* (2010.01)
*H01L 33/20* (2010.01)
(Continued)

(52) U.S. Cl.
CPC .............. *H01L 33/20* (2013.01); *H01L 33/10* (2013.01); *H01L 33/24* (2013.01); *H01L 33/32* (2013.01); *H01L 33/44* (2013.01); *H01L 33/007* (2013.01)

(58) Field of Classification Search
CPC ...................................................... H01L 33/20
See application file for complete search history.

(56) References Cited

U.S. PATENT DOCUMENTS 6,015,979 A * 1/2000 Sugiura ................. H01L 33/007
257/103
6,153,010 A * 11/2000 Kiyoku .................. B82Y 20/00
117/106
(Continued)

FOREIGN PATENT DOCUMENTS

CN 102117869 A 7/2011
CN 103022291 A 4/2013
(Continued)

OTHER PUBLICATIONS

EPO as ISA, "International Search Report and Written Opinion" dated Aug. 31, 2015 from International Application No. PCT/IB2015/053639, filed May 18, 2015, 10 pages.
(Continued)

*Primary Examiner* — Eugene Lee

(57) ABSTRACT

A lighting device according to embodiments of the invention includes a substrate with a plurality of holes that extend from a surface of the substrate. A non-III-nitride material is disposed within the plurality of holes. The surface of the substrate is free of the non-III-nitride material. A semiconductor structure is grown on the surface of the substrate. The semiconductor structure includes a light emitting layer disposed between an n-type region and a p-type region.

16 Claims, 2 Drawing Sheets

(51) Int. Cl.
*H01L 33/10* (2010.01)
*H01L 33/24* (2010.01)
*H01L 33/32* (2010.01)
*H01L 33/44* (2010.01)

(56) References Cited

U.S. PATENT DOCUMENTS

| | | | | |
|---|---|---|---|---|
| 6,498,048 | B2 * | 12/2002 | Morita | H01L 21/0237 |
| | | | | 257/E21.125 |
| 7,053,420 | B2 * | 5/2006 | Tadatomo | H01L 33/22 |
| | | | | 257/103 |
| 7,244,308 | B2 * | 7/2007 | Morita | H01L 21/0237 |
| | | | | 117/95 |
| 7,683,386 | B2 * | 3/2010 | Tanaka | H01L 21/0237 |
| | | | | 257/88 |
| 8,263,989 | B2 * | 9/2012 | Cheong | H01L 33/10 |
| | | | | 257/103 |
| 8,278,125 | B2 * | 10/2012 | Chen | H01L 21/02381 |
| | | | | 257/79 |
| 8,441,027 | B2 * | 5/2013 | Lee | H01L 21/0237 |
| | | | | 257/13 |
| 9,263,255 | B2 * | 2/2016 | Heo | H01L 33/22 |
| 9,634,193 | B2 | 4/2017 | Chae et al. | |
| 2002/0014629 | A1 * | 2/2002 | Shibata | H01L 21/0237 |
| | | | | 257/79 |
| 2006/0006408 | A1 * | 1/2006 | Suehiro | H01L 33/007 |
| | | | | 257/103 |
| 2006/0038190 | A1 * | 2/2006 | Park | H01L 33/007 |
| | | | | 257/95 |
| 2006/0166478 | A1 * | 7/2006 | Sugahara | H01S 5/227 |
| | | | | 438/602 |
| 2007/0206130 | A1 | 9/2007 | Wuu et al. | |
| 2007/0295981 | A1 | 12/2007 | Erchak et al. | |
| 2011/0127554 | A1 * | 6/2011 | Lee | H01L 33/10 |
| | | | | 257/98 |
| 2012/0080698 | A1 | 4/2012 | Chu et al. | |
| 2012/0190148 | A1 | 7/2012 | Lin et al. | |
| 2013/0015487 | A1 | 1/2013 | Okuno | |
| 2013/0087763 | A1 | 4/2013 | Kim et al. | |

FOREIGN PATENT DOCUMENTS

| | | |
|---|---|---|
| CN | 103828073 A | 5/2014 |
| EP | 1429396 A1 | 6/2004 |
| KR | 20130094483 A | 8/2013 |
| WO | 2013157786 A1 | 10/2013 |

OTHER PUBLICATIONS

TW Office Action dated Nov. 6, 2018, Taiwan Patent Application No. 104117033, 9 pages.
First Office Action dated Jun. 5, 2018, China Patent Application No. 201580028825.7, 16 pages.
CN Second Office Action dated Jan. 11, 2019, China Patent Application No. 201580028825.7, 13 pages.
EPC Communication dated Apr. 16, 2019, European Patent Application No. 15730850.3, 5 pages.
Notice of Refusal dated Apr. 9, 2019 for Japanese Patent Application No. 2016-569667, 6 pages.

* cited by examiner

LIGHT-EMITTING DEVICE WITH PATTERNED SUBSTRATE

CROSS-REFERENCE TO RELATED APPLICATIONS

The present application is a § 371 application of International Application No. PCT/IB2015/053639 filed on May 18, 2015 and entitled "LIGHT-EMITTING DEVICE WITH PATTERNED SUBSTRATE," which claims the benefit of U.S. Provisional Patent Application No. 62/005,003, filed May 30, 2014. International Application No. PCT/IB2015/053639 and U.S. Provisional Patent Application No. 62/005,003 are incorporated herein.

FIELD OF THE INVENTION

The present invention relates to a light emitting device grown on a substrate with features which may improve light extraction.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a substrate designed to improve light extraction efficiency from a semiconductor light emitting device, described in more detail in US 2013/0015487. On the sapphire substrate 10, a plurality of grooves 11 extending in a first direction (along the x-axis) is formed in a parallel stripe pattern. The remaining ungrooved surface is a top surface 10a of the substrate. The width of each groove 11 is 1.5 μm in the y-axis direction, and the width of each stripe of ungrooved portion 10a in the y-axis direction is 1.5 μm in the y-axis direction. The depth of each groove 11 is 0.1 μm. The depth of each groove 11 may be within a range from 100 Å to 3 μm.

A plurality of $SiO_2$ dielectric stripes 15 are formed in parallel on the bottom surfaces and side surfaces of the grooves 11, and on the surface 10a of the sapphire substrate 10. Each dielectric stripe 15 extends in a second direction (y-axis direction). The width of each dielectric stripe 15 is 1.5 μm in the x-axis direction. The thickness of each dielectric stripe 15 may be within a range of 100 Å to 1 μm. On the sapphire substrate 10 having the configuration shown in FIG. 1, an aluminum nitride (AlN) buffer layer having a film thickness of 10 nm is deposited. The buffer layer (not shown in FIG. 1) is formed over the bottom surfaces 11a and side surfaces 11b of the grooves 11, the surface 10a, and the top surfaces 15a and the side surface 15b of the dielectric stripes 15.

SUMMARY

It is an object of the invention to provide a light emitting device with improved extraction.

A lighting device according to embodiments of the invention includes a substrate with a plurality of holes that extend from a surface of the substrate. A non-III-nitride material is disposed within the plurality of holes. The surface of the substrate is free of the non-III-nitride material. A semiconductor structure is grown on the surface of the substrate. The semiconductor structure includes a light emitting layer disposed between an n-type region and a p-type region.

Though in the discussion below, the substrate is sapphire, any suitable substrate material may be used such as sapphire, SiC, silicon, GaN, III-nitride, or composite substrates. In some embodiments, the substrate has an index of refraction that is less than that of the III-nitride material grown on the substrate. For example, sapphire has an index of refraction of 1.7, while GaN has an index of refraction of 2.4.

DETAILED DESCRIPTION

Figure 1:
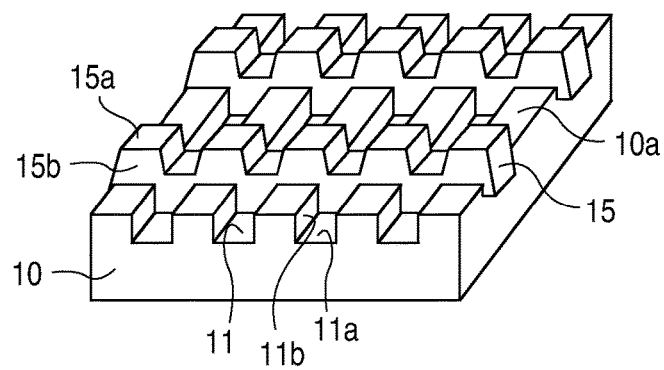
FIG. 1 illustrates a prior art substrate for improving light extraction efficiency from a semiconductor light emitting device.

A semiconductor light emitting device structure may be formed on the substrate illustrated in FIG. 1. In a device with a smooth substrate, a waveguide is formed between the substrate and the semiconductor material. Due to the different indices of refraction of the substrate and the semiconductor material the waveguide traps light in the device. In a device with the substrate of FIG. 1, the grooves 11 and the dielectric stripes 15 on the substrate interrupt the waveguide and may thereby improve light extraction from the device. Light emitted in the direction of the substrate may be scattered, by the grooves 11 and/or the dielectric stripes 15, such that the light is more likely to be extracted from the device.

In the structure illustrated in FIG. 1, the dielectric stripes 15 are formed on both flat surfaces (surfaces 10a between the grooves 11, and the bottom surfaces 11a of the grooves 11), and non-flat surfaces (vertical sidewalls 11b of grooves 11). The dielectric material on the flat surfaces has a minimal effect on light extraction, which can detract from the crystal growth quality of the semiconductor device structure grown on the substrate.

In some embodiments of the invention, features are formed on the substrate, and are coated with one or more anti-reflection, scattering and/or gradient index coating layers, before epitaxial growth of the semiconductor device structure on the substrate. The one or more coating layers may totally or partially fill up features formed in the substrate surface. The main function of the features and the coating layer(s) may be twofold: (i) increase transmission of light from the III-nitride material into the substrate, and (ii) control the direction of light to tune the far-field emission from the device.

The coating layer(s) are restricted to the surface areas of the substrate that do not significantly contribute to the nucleation of the III-nitride material during growth. These areas are generally the slanted and/or vertical areas of the features formed relative to the plane of the substrate (relative to the plane described by the x and y axis and perpendicular to the z axis). Forming non-III-nitride coating layers such as dielectric layers on non-flat surfaces on the substrate does not significantly affect crystal growth on the substrate, but may enhance light extraction from the device.

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 2:
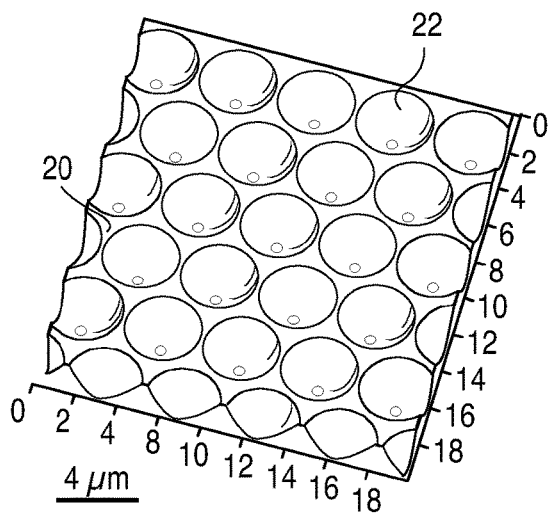
FIG. 2 is a plan view of a portion of a substrate with features, according to embodiments of the invention.

FIG. 2 is a plan view of a portion of a substrate 20 including features 22, according to embodiments of the invention.

The features 22 illustrated in FIG. 2 are holes formed in the substrate 20 which extend downward from the top surface of the substrate. The holes do not extend through the entire thickness of the substrate. The holes may be any suitable shape, including, for example, holes with vertical sides and flat bottoms, holes with sloped sides and flat bottoms, truncated inverted pyramids, truncated inverted cones, inverted pyramids, inverted cones, or any other suitable shape. The holes may be rotationally symmetric along an axis perpendicular to the top surface of the substrate or other axis in some embodiments, though this is not required. The holes may be arranged in any suitable pattern, including, for example, an array such as a triangular, square, hexagonal, or any other suitable array, a random arrangement, or a quasi-random arrangement such as an Archimedean lattice.

The holes may be formed by etching, mechanical techniques such as drilling, or any other suitable technique. For example, the holes may be formed by wet chemical etching, in a chemical bath of phosphoric acid or sulfuric acid for example, or by dry etching techniques in an inductively coupled plasma (ICP) etcher.

Figure 3:
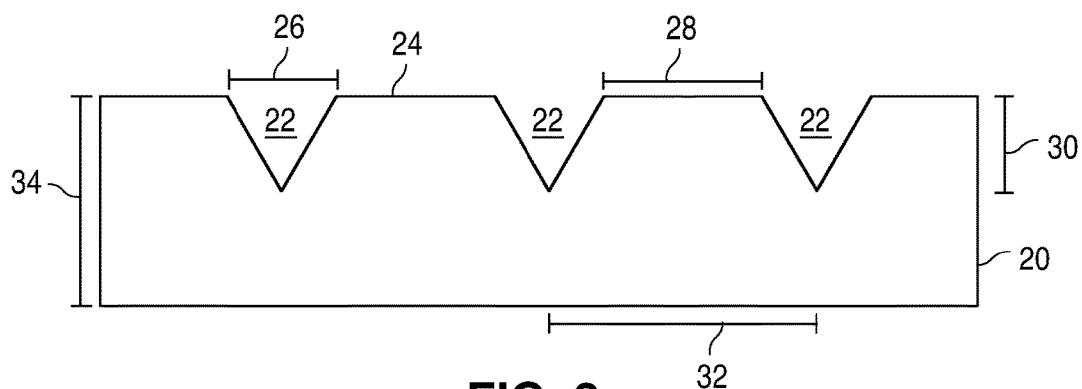
FIG. 3 is a cross sectional view of a portion of a substrate with features, according to embodiments of the invention.

FIG. 3 is a cross sectional view of a portion of a substrate 20 including typical features 22. The plane of the substrate, formed by the x and y axis of FIG. 1 is, for example, the top or the bottom of the structure illustrated in FIG. 3. The embodiment of features 22 illustrated in FIG. 3 has an inverted triangular cross section where the axis of each hole is oriented perpendicular to the plane of the substrate. The features may have any suitable cross section. For example, the features may have flat bottoms or rounded bottoms. The features may have vertical sides, sloped sides, curved sides, or segmented sides, where different segments have different slopes and/or shapes. In some embodiments, the sloped sides of the features are orthogonal or substantially orthogonal to the direction of maximum angular emission of the light emitting layers. For example, if light emitted by the light emitting layers is emitted in a pattern with lobe maxima at 60 degrees from normal to a major plane of the device, then the sloped sidewalls of the features may be oriented at an angle 30 degrees from normal to a major plane of the device.

The top surface 24 of the substrate 20 may be flat between features 22, as illustrated in FIG. 3, though this is not required. For example, the top surface 24 may be patterned, roughened, or textured, or may be sloped relative to the orientation of the holes.

The holes may be oriented so that the axes of all or most of the holes are perpendicular to the plane of the substrate. In the alternative, the axes of all or most of the holes may be angled relative to the plane of the substrate, or the axes of the holes may be oriented randomly.

The substrate 20 may have a thickness 34 of at least 100 µm in some embodiments, no more than 500 µm in some embodiments, at least 200 µm in some embodiments, and no more than 400 µm in some embodiments.

At the opening of the feature 22, at the top edge of the substrate, the features 22 may have a width 26 of at least 1 µm in some embodiments, no more than 20 µm in some embodiments, at least 5 µm in some embodiments, and no more than 15 µm in some embodiments. The features 22 may have a depth 30 of at least 1 µm in some embodiments, no more than 20 µm in some embodiments, at least 5 µm in some embodiments, and no more than 15 µm in some embodiments. The spacing 32 between the centers of nearest neighbor features may be at least 2 µm in some embodiments, no more than 50 µm in some embodiments, at least 20 µm in some embodiments, and no more than 40 µm in some embodiments. The width 28 of the top surface 24 of substrate 20 between neighboring features 22 may be at least 100 nm in some embodiments, no more than 50 µm in some embodiments, at least 5 µm in some embodiments, and no more than 25 µm in some embodiments. As illustrated in FIG. 3, the holes do not penetrate the entire thickness of the substrate. In the alternative, some or all of the holes may penetrate the entire thickness of the substrate.

Figure 4:
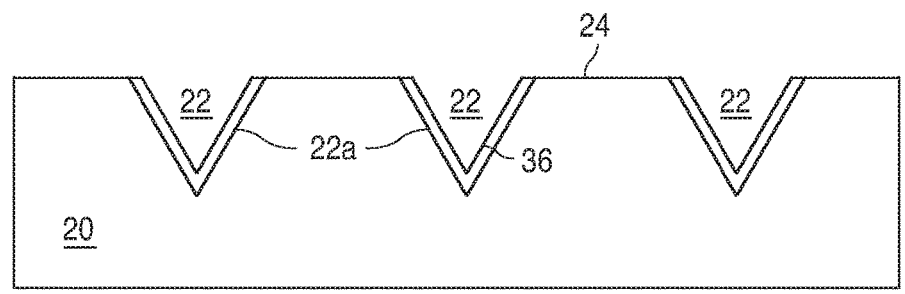
FIG. 4 is a cross sectional view of the structure of FIG. 3 after forming one or more coating layers on surfaces of the features.

FIG. 4 illustrates a substrate with features 22 and one or more coating layers. The coating layer 36 is formed only on the slanted sidewalls 22a of features 22. The coating layer 36 may be formed by conventional photomasking processes, as known in the art. For example, the substrate may be masked, then the coating layer formed, then the mask removed; the coating layer may be formed, then patterned by masking and etching; or the coating layer may be selectively formed only on sidewalls of the features. The top, often flat surface 24 of the substrate 20 between features 22 may be left unaltered (i.e. not covered by coating layer 36) to insure the correct nucleation of the crystallization process during epitaxial growth of the III-nitride device structure, described below. The sidewalls 22a of the features 22 do not contribute significantly to the nucleation of the III-nitride crystal during epitaxial growth, as the III-nitride crystal will preferentially nucleate on the substrate surface 24 over the coating layer 36.

The coating layer(s) 36 may include any suitable materials that are compatible with the epitaxial process. Examples of suitable materials include non-III-nitride materials, dielectric materials, materials formed by techniques other than epitaxial growth such as deposition, SiN, $SiO_2$, $TiO_2$, oxides, and nitrides. The refractive index of coating layer(s) 36 may be in some embodiments between that of the substrate and that of GaN (e.g. such as SiN and composites of $SiO_2$ and $TiO_2$, to form layers with refractive index ranging between 1.5 and 2.5).

Multiple coating layers 36a to 36b (FIG. 5) may be used. Suitable combinations of layers 36a to 36b may be selected to amplify the intended effects of either increasing light transmission from the III-nitride material into the substrate, or directing the emitted light beam in a particular angular direction, or both. The multiple coating layers 36a to 36b may be selected based on the principle of antireflector coating, or by emulating a gradient index material to smoothly transition light from high index into low index. In some embodiments, the refractive index of the coating layer 36a closest to and typically in contact with the substrate 20 (the first-deposited coating layer) has the lowest refractive index, i.e. the refractive index closest to the refractive index of the substrate 20. The coating layer 36b furthest from the substrate 20 (the last-deposited coating layer) has the highest refractive index, i.e. the refractive index closest to the refractive index of the III-nitride layers. Thus, the stack of coating layers 36a to 36b in some embodiments may form a gradient index (GRIN) optical interface between the III-nitride material and the substrate 20.

In one example, the coating layer 36 is a single layer of SiN that fills at least 20% of the depth of the holes, up to 50% of the depth of the holes. For example, in the case of holes that are 2 μm deep, the coating layer 36 may have a thickness of up to 1 μm.

The coating layer(s) 36 may partially or fully fill the features 22. In particular, in some embodiments, the coating layers 36 may fill the features 22 such that the top surface of the coating layers 36 is flush with the top surface 24 of the substrate between features. Filling the features 22 minimizes the non-nucleating surfaces.

Figure 5:
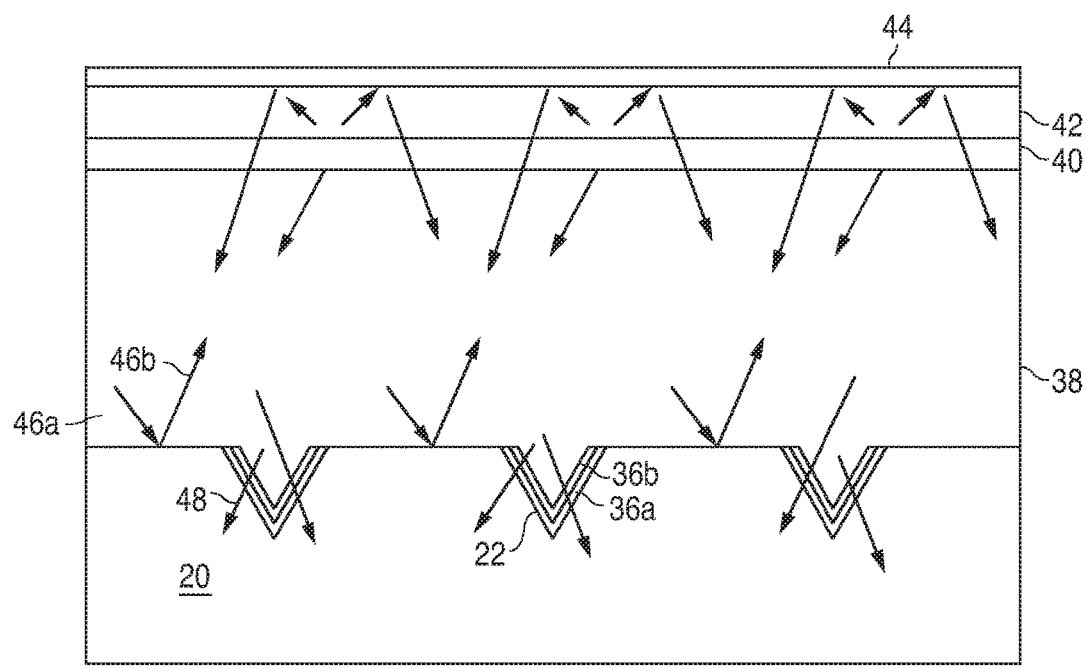
FIG. 5 illustrates a semiconductor device structure formed on the substrate of FIG. 4.

After forming the coating layer(s) 36, a semiconductor device structure is grown, as illustrated in FIG. 5. The semiconductor structure includes a light emitting or active region sandwiched between n- and p-type regions.

An n-type region 38 may be grown first and may include multiple layers of different compositions and dopant concentration including, for example, preparation layers such as buffer layers or nucleation layers, contact layers, and confinement layers, which may be n-type or not intentionally doped, and n- or even p-type device layers designed for particular optical, material, or electrical properties desirable for the light emitting region to efficiently emit light.

The first portion of the n-type region may fill in the features and coalesce to form a surface of sufficiently high quality to grow the device layers. This portion of the n-type region may be at least 2 μm thick in some embodiments, and no more than 5 μm thick in some embodiments. The initially grown III-nitride material nucleates preferentially on the top surface 24 of the substrate between features, and not on the coating layers 36 in the features 22.

A light emitting or active region 40 is grown over the n-type region. Examples of suitable light emitting regions include a single thick or thin light emitting layer, or a multiple quantum well light emitting region including multiple thin or thick light emitting layers separated by barrier layers.

A p-type region 42 may then be grown over the light emitting region. Like the n-type region, the p-type region may include multiple layers of different composition, thickness, and dopant concentration, including layers that are not intentionally doped, or n-type layers.

After growth, a p-contact 44 is formed on the surface of the p-type region. The p-contact 44 often includes multiple conductive layers such as a reflective metal and a guard metal which may prevent or reduce electromigration of the reflective metal. The reflective metal is often silver but any suitable material or materials may be used.

FIG. 5 illustrates the behavior of light in the device. Light that strikes the surface 24 of substrate 20 at glancing angles, such as ray 46a, may be totally internally reflected by the waveguide between the substrate and the III-nitride material, trapping the light within the device, as illustrated by ray 46b. The features 22 interrupt the waveguide, such that light emitted into the features 22 at glancing angles, such as ray 48, are extracted from the semiconductor material. Some rays that are reflected by surface 24 are reflected again by the contact 44, then incident on a feature 22, where the ray is ultimately extracted from the semiconductor material. In the absence of features 22, light may keep being reflected by multiple surfaces at the same angles and remain trapped in the semiconductor structure, until the light energy was converted to heat.

The structure illustrated in FIG. 5 may be formed into any suitable device structure. In general, in a device with a substrate with light extraction features as described above, light is extracted from the device primarily through the substrate, which remains part of the device, though this is not required. Though a flip chip is illustrated in FIG. 6, the structure of FIG. 5 may be formed into any suitable device.

Figure 6:
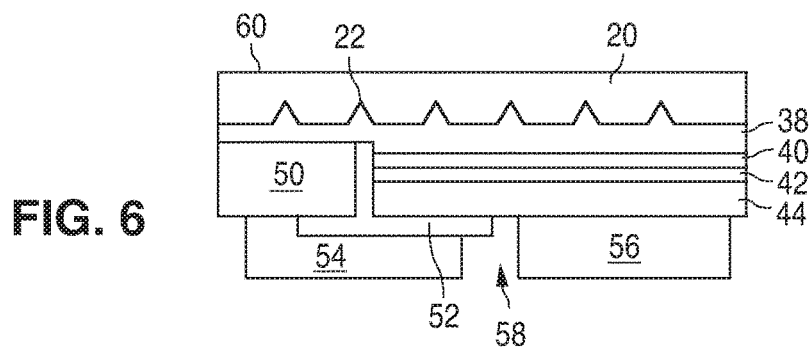
FIG. 6 illustrates a flip chip device.

As illustrated in FIG. 6, after forming the p-contact 44, a portion of the p-contact 44, the p-type region 42, and the active region 40 is removed to expose a portion of the n-type region 38 on which an n-contact 50 is formed. The n- and p-contacts 50 and 44 are electrically isolated from each other by a gap which may be filled with a dielectric 52 such as an oxide of silicon or any other suitable material. Multiple n-contact vias may be formed; the n- and p-contacts 50 and 44 are not limited to the arrangement illustrated in FIG. 6. The n- and p-contacts may be redistributed to form bond pads (not shown in FIG. 6) with a dielectric/metal stack, as is known in the art.

In order to form electrical connections to the device, one or more interconnects 54 and 56 are formed on or electrically connected to the n- and p-contacts 50 and 44. Interconnect 54 is electrically connected to n-contact 50 in FIG. 6. Interconnect 56 is electrically connected to p-contact 44. Interconnects 54 and 56 are electrically isolated from the n- and p-contacts 50 and 44 and from each other by dielectric layer 52 and gap 58. Interconnects 54 and 56 may be, for example, solder, stud bumps, gold layers, or any other suitable structure.

Many individual LEDs are formed on a single substrate wafer then diced from a wafer of devices. Before, during, or after dicing, the substrate 20 may be thinned. In some embodiments, in addition to or instead of thinning, the back side surface 60 of substrate 20 is patterned, textured, or roughened to improve light extraction from the substrate into the surrounding air.

The device illustrated in FIG. 6 may be, for example, about 1 mm long on a side. Accordingly, the substrate of a single device many include tens or hundreds of features in some embodiments. In one example, there may be an average of one to two features in every 3 μm×3 μm portion of substrate area.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:
1. A lighting device comprising:
   a substrate comprising a plurality of holes, wherein the holes extend from a top surface of the substrate;

a semiconductor structure grown on the top surface of the substrate, the semiconductor structure comprising a light emitting layer disposed between an n-type region and a p-type region, a portion of the semiconductor structure being disposed in the holes; and a non-III-nitride material disposed within the plurality of holes and forming a gradient index optical interface between the semiconductor structure and the substrate, the top surface of the substrate being free of the non-III-nitride material, wherein the gradient index optical interface smoothly transitions from a first refractive index to a second refractive index between the semiconductor structure and the substrate, the second refractive index being closer to a refractive index of the substrate than is the first refractive index.

2. The lighting device of claim 1 wherein the plurality of holes have a triangular cross section.

3. The lighting device of claim 1 wherein the non-III-nitride material includes a stack of layers that forms the gradient index optical interface between the semiconductor structure and the substrate.

4. The lighting device of claim 1 wherein the plurality of holes have a width at the top surface between 1 µm and 20 µm.

5. The lighting device of claim 1 wherein the plurality of holes extend into the substrate a depth of between 1 µm and 20 µm.

6. The lighting device of claim 1 wherein a spacing between centers of nearest neighbor holes is between 2 µm and 50 µm.

7. The lighting device of claim 1 wherein the plurality of holes are arranged in an array.

8. The lighting device of claim 1 wherein an average of between 1 and 2 holes is formed in every 3 µm by 3 µm area of the substrate.

9. A lighting device comprising:

a sapphire substrate comprising a plurality of holes extending from a flat surface of the substrate, wherein the holes comprise sidewalls that are slanted relative to the flat surface of the substrate;

a dielectric material disposed on the slanted sidewalls and not on the flat surface of the substrate; and a semiconductor structure grown on the flat surface of the substrate, the semiconductor structure comprising a III-nitride light emitting layer disposed between an n-type region and a p-type region;

wherein a portion of the semiconductor structure is disposed in the holes; and the dielectric material includes a stack of layers that forms a gradient index optical interface between the semiconductor structure and the substrate, the gradient index optical interface smoothly transiting from a first refractive index to a second refractive index between the semiconductor structure and the substrate, the second refractive index being closer to a refractive index of the substrate than is the first refractive index.

10. The lighting device of claim 9 wherein the plurality of holes have a triangular cross section.

11. The lighting device of claim 9 wherein the plurality of holes are arranged in an array.

12. The lighting device of claim 9 wherein an average of between 1 and 2 holes is formed in every 3 µm by 3 µm area of the substrate.

13. The lighting device of claim 9 wherein the dielectric material is disposed in the plurality of holes, between the semiconductor structure and the substrate.

14. The lighting device of claim 1, wherein the first refractive index is closer to a refractive index of the semiconductor structure than is the second refractive index.

15. The lighting device of claim 1, wherein the gradient index optical interface is configured to receive light emitted from the light emitting layer and direct the light into the substrate.

16. The lighting device of claim 9, wherein the gradient index optical interface is configured to receive light emitted from the III-nitride light emitting layer and direct the light into the substrate.

* * * * *